United States Patent
Chen et al.

(10) Patent No.: US 8,934,249 B2
(45) Date of Patent: Jan. 13, 2015

(54) ELECTRONIC DEVICE WITH HEAT DISSIPATION ASSEMBLY

(75) Inventors: Tsung-Ming Chen, New Taipei (TW); Yao-Ting Chang, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 230 days.

(21) Appl. No.: 13/610,891

(22) Filed: Sep. 12, 2012

(65) Prior Publication Data

US 2014/0063746 A1    Mar. 6, 2014

(30) Foreign Application Priority Data

Aug. 30, 2012   (TW) .................................. 101131443

(51) Int. Cl.
*H05K 7/20*    (2006.01)
*H01L 23/34*   (2006.01)

(52) U.S. Cl.
USPC ............................ 361/719; 361/704; 361/720

(58) Field of Classification Search
USPC .............................. 361/679.54, 704, 719–721
See application file for complete search history.

(56) References Cited

U.S. PATENT DOCUMENTS

| | | | | |
|---|---|---|---|---|
| 5,923,084 | A * | 7/1999 | Inoue et al. | 257/712 |
| 6,180,436 | B1 * | 1/2001 | Koors et al. | 438/117 |
| 6,365,964 | B1 * | 4/2002 | Koors et al. | 257/718 |
| 6,696,643 | B2 * | 2/2004 | Takano | 174/520 |
| 6,816,377 | B2 * | 11/2004 | Itabashi et al. | 361/704 |
| 7,031,165 | B2 * | 4/2006 | Itabashi et al. | 361/719 |
| 7,057,891 | B2 * | 6/2006 | Ito et al. | 361/679.46 |
| 7,304,854 | B2 * | 12/2007 | Tseng et al. | 361/719 |
| 2004/0136162 | A1 * | 7/2004 | Asai et al. | 361/715 |
| 2008/0128895 | A1 * | 6/2008 | Oman et al. | 257/712 |
| 2012/0300405 | A1 * | 11/2012 | Weeber et al. | 361/709 |

FOREIGN PATENT DOCUMENTS

WO    WO 2011069828 A1 *  6/2011  ............... H05K 9/00

* cited by examiner

*Primary Examiner* — Robert J Hoffberg
(74) *Attorney, Agent, or Firm* — Novak Druce Connolly Bove + Quigg LLP

(57) ABSTRACT

An electronic device includes a sidewall, a circuit board arranged on the sidewall, an electronic component set on a side of the circuit board opposite to the sidewall, and a heat dissipation assembly connected between the sidewall and the circuit board.

6 Claims, 3 Drawing Sheets

ELECTRONIC DEVICE WITH HEAT DISSIPATION ASSEMBLY

BACKGROUND

1. Technical Field

The present disclosure relates to an electronic device with a heat dissipation assembly.

2. Description of Related Art

Many electronic devices include a heat sink directly attached to an upper surface of an internally mounted electronic component for heat dissipation. With the development of computer technology, the electronic components, such as central processing units, generate more and more heat. Therefore, such heat dissipation method is now often inadequate.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
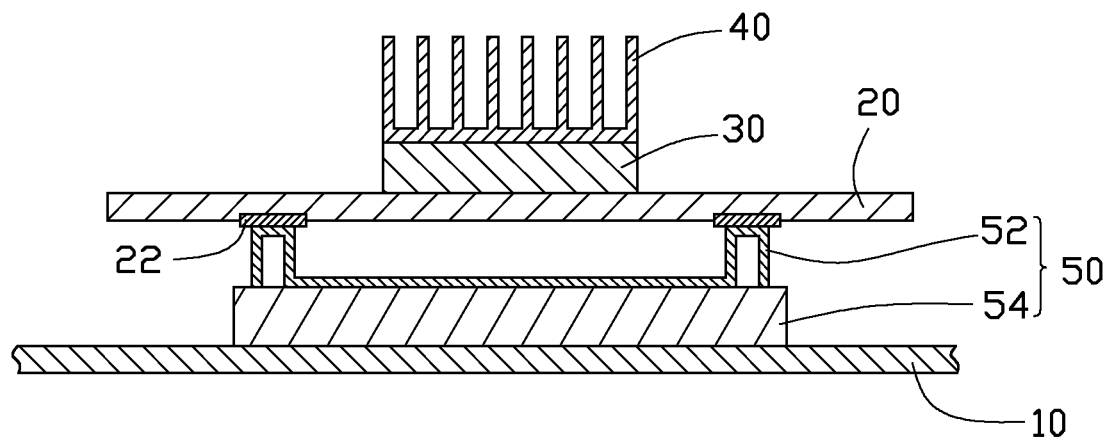
FIG. 1 is a cross-sectional view of an embodiment of an electronic device, wherein the electronic device includes a heat dissipation member.

Referring to FIG. 1, an exemplary embodiment of an electronic device includes a sidewall 10 of an enclosure (not shown), a circuit board 20 mounted on the sidewall 10, an electronic component 30, a heat sink 40, and a heat dissipation assembly 50. The sidewall 10 is made of metal. The circuit board 20 is spaced from the sidewall 10. In the embodiment, the electronic component 30 is a central processing unit (CPU) 30.

The CPU 30 is set on a side of the circuit board 20 opposite to the sidewall 10. The heat sink 40 is attached on a side of the CPU 30 opposite to the circuit board 20. Two elongated heat conduction bars 22 are embedded in and exposed through a bottom of the circuit board 20 facing the sidewall 10, and are respectively located at opposite sides of the CPU 30. The heat conduction bars 22 are made of metal that has good heat conductivity, such as copper. The heat conduction bars 22 are arranged between traces of the circuit board 20 respectively, thus avoiding forming short circuits with the traces and the components of the circuit board 20.

Figure 2:
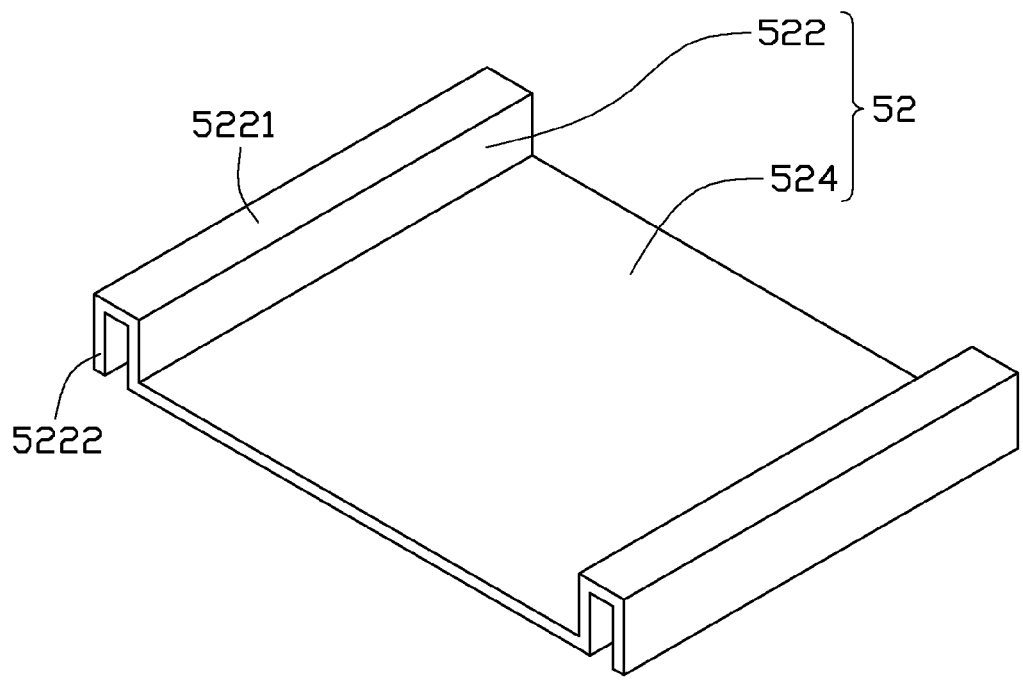
FIG. 2 is an enlarged, isometric view of the heat dissipation member of FIG. 1.

Referring to FIG. 2, the heat dissipation assembly 50 includes a heat dissipation member 52 and a heat conduction member 54. The heat dissipation member 52 includes two U-shaped first heat dissipation portions 522 and a flat second heat dissipation portion 524 connected between the first heat dissipation portions 522. Each first heat dissipation portion 522 includes an abutting section 5221 and two side plates 5222 extending from opposite sides of the abutting section 5221. The second heat dissipation portion 524 is connected between bottoms of two adjacent side plates 5222 of the first heat dissipation portions 522. The heat dissipation member 52 and the heat conduction member 54 are made of heat conductive metal.

The heat dissipation assembly 50 is arranged between the circuit board 20 and the sidewall 10. A bottom of the heat conduction member 54 abuts the sidewall 10. The second heat dissipation portion 524 abuts a top of the heat conduction member 54. The abutting sections 5221 abut the heat conduction bars 22 respectively.

A part of the heat generated by the electronic component 30 is dissipated by the heat sink 40. Another part of the heat generated by the electronic component 30 is conducted to the heat conduction bars 22 through the circuit board 20, and then conducted to the sidewall 10 through the heat dissipation member 52 and the heat conduction member 54. The heat dissipation assembly 50 is also cooled by air flowing under the circuit board 20.

Figure 3:
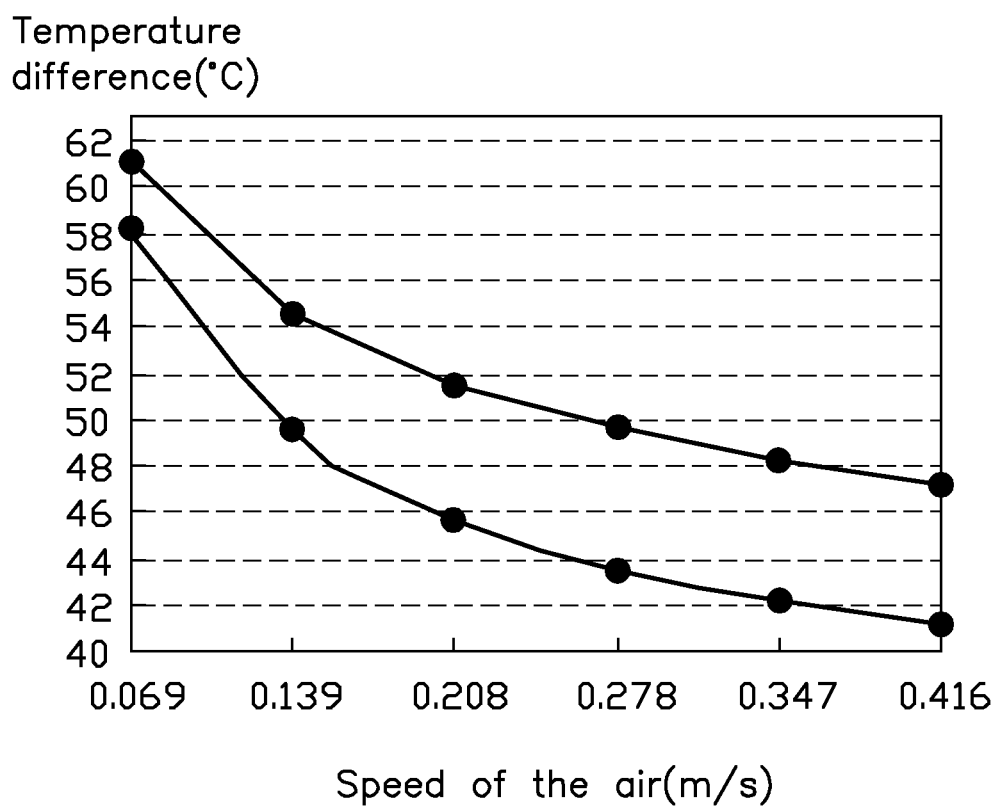
FIG. 3 is a graph showing the heat dissipation effect of a related-art and the embodiment of FIG. 1.

Referring to FIG. 3, the abscissa shows the speed of the airflow, the ordinate shows a temperature difference between the temperature of the CPU 30 and the room temperature. The upper curve and the lower curve respectively show the heat dissipation effect of a related-art and this embodiment. For the same speed of airflow, the temperature of the CPU 30 of this embodiment is about 3.5-7 degrees Celsius lower than the temperature of the electronic component of the related-art.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. An electronic device, comprising:
   a sidewall;
   a circuit board mounted on the sidewall and spaced from the sidewall, the circuit board comprising:
      traces; and
      two elongated heat conduction bars embedded in and exposed through a bottom of the circuit board;
   an electronic component set on a side of the circuit board opposite to the sidewall, two elongated heat conduction bars are respectively located at opposite sides of the electronic component and are arranged between the traces of the circuit board in order to avoid forming short circuits with the traces of the circuit board and the electrical component; and
   a heat dissipation assembly arranged between the sidewall and the circuit board, and abutting the circuit board and the sidewall, the heat dissipation assembly comprising:
      a heat dissipation member; and
      a heat conduction member contacting with the heat dissipation member;
      wherein a bottom of the heat conduction member abuts the sidewall and a top of the heat dissipation member abuts the bottom of the circuit board opposite to the electronic component.

2. The electronic device of claim 1, wherein the heat conduction bars are made of metal of good heat conductivity.

3. The electronic device of claim 1, wherein the heat dissipation member comprises two first heat dissipation portions and a second heat dissipation portion connected between the first heat dissipation portions, the first heat dissipation portions abut the heat conduction bars respectively, the second heat dissipation portion abuts a top of the heat conduction member.

4. The electronic device of claim 3, wherein each first heat dissipation portion comprises an abutting section and two side plates extending down from opposite sides of the abutting section, the second heat dissipation portion is connected between bottoms of two adjacent side plates of the first heat dissipation portions, the abutting sections of the first heat dissipation portions abut the heat conduction bars respectively.

5. The electronic device of claim 1, wherein the heat dissipation member and the heat conduction member are made of heat conductive metal.

6. The electronic device of claim 1, further comprising a heat sink attached on the electronic component opposite to the circuit board.

* * * * *